United States Patent
Klimczak et al.

(10) Patent No.: US 11,955,947 B2
(45) Date of Patent: Apr. 9, 2024

(54) BALUN AND AMPLIFIER INCLUDING BALUN

(71) Applicant: TRUMPF Huettinger Sp. z o. o., Zielonka (PL)

(72) Inventors: Andrzej Klimczak, Warsaw (PL); Marcin Golan, Warsaw (PL); Pawel Ozimek, Warsaw (PL)

(73) Assignee: TRUMPF HUETTINGER SP. Z O. O., Zielonka (PL)

( * ) Notice: Subject to any disclaimer, the term of this patent is extended or adjusted under 35 U.S.C. 154(b) by 583 days.

(21) Appl. No.: 17/163,605

(22) Filed: Feb. 1, 2021

(65) Prior Publication Data

US 2021/0159872 A1  May 27, 2021

Related U.S. Application Data

(63) Continuation of application No. PCT/EP2019/070378, filed on Jul. 29, 2019.

(30) Foreign Application Priority Data

Aug. 2, 2018 (EP) ..................... 18461596

(51) Int. Cl.
*H03F 3/26* (2006.01)
*H03H 7/42* (2006.01)

(52) U.S. Cl.
CPC ............... *H03H 7/42* (2013.01); *H03F 3/265* (2013.01); *H03F 2200/09* (2013.01); *H03F 2200/451* (2013.01)

(58) Field of Classification Search
CPC ....... H03H 7/42; H03F 3/265; H03F 2200/09; H03F 2200/451; H03F 2200/06; H03F 2200/534; H03F 1/565; H03F 3/193; H03F 3/2171; H03F 3/2176
USPC ................................................... 330/301, 251
See application file for complete search history.

(56) References Cited

U.S. PATENT DOCUMENTS

| | | | |
|---|---|---|---|
| 4,080,573 A * | 3/1978 | Howell | H03D 7/1433 455/333 |
| 5,061,910 A | 10/1991 | Bouny | |
| 5,678,224 A * | 10/1997 | Murtojarvi | H03D 7/1408 455/333 |
| 8,248,180 B2 | 8/2012 | Podell | |

(Continued)

FOREIGN PATENT DOCUMENTS

| | | |
|---|---|---|
| DE | 69017809 T2 | 11/1995 |
| DE | 102017208917 A1 | 11/2018 |

(Continued)

*Primary Examiner* — Hieu P Nguyen
(74) *Attorney, Agent, or Firm* — LEYDIG, VOIT & MAYER, LTD.

(57) ABSTRACT

A balun configured for a power range between 500 W and 5 kW output includes a balanced signal port comprising a first connection and a second connection and further includes a single-ended signal port comprising a third connection and a fourth connection, the fourth connection being connected to ground. In addition, the balun includes a first capacitor disposed between the first connection and a first end of a first resistor and a second capacitor disposed between the second connection and the first end of the first resistor. A second end of the first resistor is connected to ground.

26 Claims, 2 Drawing Sheets

(56) References Cited

U.S. PATENT DOCUMENTS

| | | | |
|---|---|---|---|
| 8,472,532 B2 * | 6/2013 | Schley-May | H04B 3/30 |
| | | | 375/349 |
| 8,498,604 B2 * | 7/2013 | Jiang | H03D 7/1408 |
| | | | 455/313 |
| 2004/0080376 A1 | 4/2004 | Kaehs | |
| 2010/0231316 A1 | 9/2010 | Jiang | |
| 2011/0312295 A1 | 12/2011 | Jiang et al. | |
| 2015/0326255 A1 | 11/2015 | Dally | |
| 2015/0381057 A1 | 12/2015 | Luu | |
| 2017/0068489 A1 | 3/2017 | Alonso et al. | |

FOREIGN PATENT DOCUMENTS

| | | |
|---|---|---|
| EP | 1601098 B1 | 9/2010 |
| EP | 3110003 A2 | 12/2016 |
| JP | H11136011 A | 5/1999 |
| JP | 2004518384 A | 6/2004 |
| JP | 2008227006 A | 9/2008 |
| JP | 2015220481 A | 12/2015 |
| JP | 2017052132 A | 3/2017 |

* cited by examiner

BALUN AND AMPLIFIER INCLUDING BALUN

CROSS REFERENCE TO RELATED APPLICATIONS

This application is a continuation of International Application No. PCT/EP2019/070378 (WO 2020/025549 A1), filed on Jul. 29, 2019, and claims benefit to European Patent Application No. EP 18461596.1, filed Aug. 2, 2018. Both of the aforementioned applications are hereby incorporated by reference herein.

FIELD

The present disclosure relates to a balun configured for a power range between 500 W and 5 kW output and to a power amplifier comprising such a balun.

BACKGROUND

In single-ended circuits, also named unbalanced circuits, one conductor is used for carrying a signal and the ground plane is used for the return path of the signal. The conductor and the ground plane form a complete signal path. The voltage on the ground plane is then the reference for the signal. Such an unbalanced signal is also called common mode signal. In balanced circuits, two conductors are used, one carrying the signal and the other one carrying the return signal. Such a balanced signal is also called differential mode signal.

Baluns (balanced/unbalanced transformers) are transformers capable of converting signals between a balanced circuit at the balanced signal port side of the balun and an unbalanced circuit at the single-ended signal port side of the balun and vice versa.

SUMMARY

In an embodiment, the present invention provides a balun configured for a power range between 500 W and 5 kW output. The balun includes a balanced signal port comprising a first connection and a second connection and further includes a single-ended signal port comprising a third connection and a fourth connection, the fourth connection being connected to ground. In addition, the balun includes a first capacitor disposed between the first connection and a first end of a first resistor and a second capacitor disposed between the second connection and the first end of the first resistor. A second end of the first resistor is connected to ground.

BRIEF DESCRIPTION OF THE DRAWINGS

The subject matter of the present disclosure will be described in even greater detail below based on the exemplary figures. The invention is not limited to the exemplary embodiments. All features described and/or illustrated herein can be used alone or combined in different combinations in embodiments. The features and advantages of various embodiments will become apparent by reading the following detailed description with reference to the attached drawings which illustrate the following.

DETAILED DESCRIPTION

Figure 1:
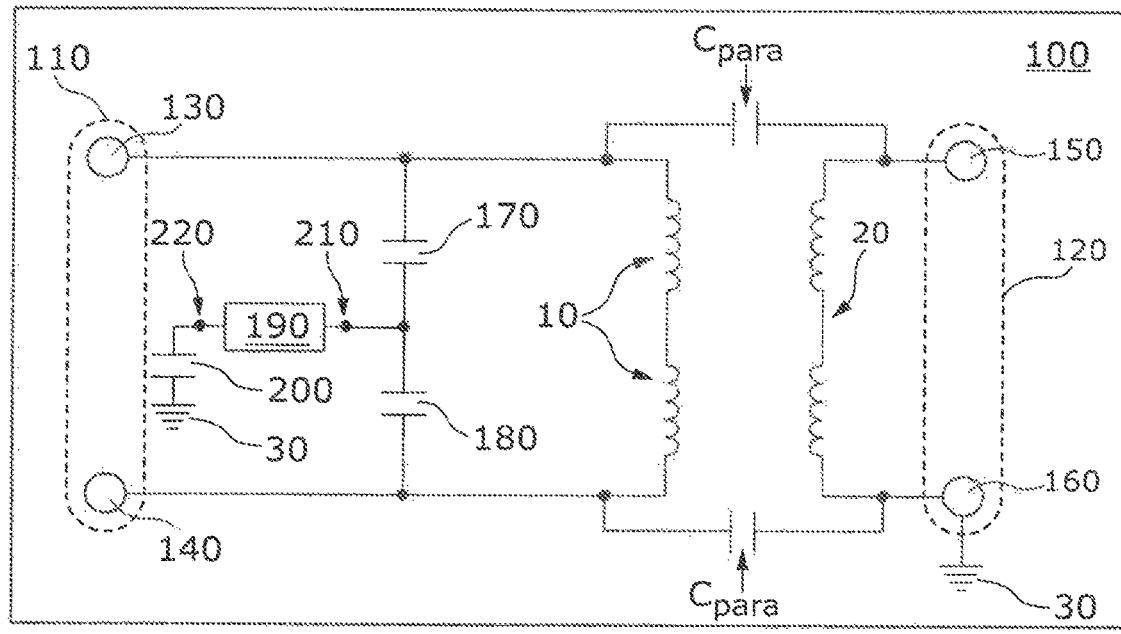
FIG. 1 provides a schematic view of a balun.

The present disclosure provides for improving signal quality provided by a balun.

According to the present disclosure, a balun is provided that comprises a balanced signal port with a first connection and a second connection. The balun further comprises a single-ended signal port with a third connection and a fourth connection, where the fourth connection is connected to ground. There is a first capacitor between the first connection and a first end of a first resistor and a second capacitor between the second connection and the first end of the first resistor. A second end of the first resistor is connected to ground.

The first resistor may be between 10Ω and 200Ω, in particular between 20Ω and 100Ω.

The rated power of the first resistor may be a value between 0.1% and 5% of the nominal output power of the balun.

The rated voltage of the first resistor may be a value between 100 V and 1000 V.

The first and preferably also the second capacitor may have values in the range of 1 pF to 800 pF.

The first and preferably also the second capacitor may be configured for a frequency between 10 kHz and 200 MHz.

The first and preferably also the second capacitor may be configured for a maximum voltage larger than 200 V.

The first resistor may serve to reduce common mode current at the balanced signal port of the balun. It may dissipate unwanted even harmonics from possible resonances of circuits connected to this balanced signal port of the balun. The choice of the size of the first resistor is then a design choice between reducing the common mode current at the balanced signal port and minimizing the heat dissipated in the first resistor.

In an embodiment, the balun may comprise a primary winding connected to the balanced signal port and a secondary winding connected to the single-ended signal port. The primary and the secondary winding may be realized in a planar manner with strip conductors on a planar circuit board. The balun may allow galvanic isolation in between input and output connection. This may allow to connect one of the output connections to protective earth and to isolate it from DC voltages present on the input side of the circuit.

The advantage of this embodiment of the balun is that it is particularly suitable for the desired frequency range, e.g. Medium Frequencies and Radio Frequencies. With Medium Frequencies (MF) here are meant frequencies in the range of 9 kHz to 900 kHz and with Radio Frequencies here are meant frequencies in the range above 900 kHz up to 180 MHz. It may allow for a smaller size of the balun, as compared to baluns which rely on the length of the transmission lines to be as long as lambda/4 of the wavelength of the conveyed signal.

It has been found that there are parasitic capacitances in between the two signal ports of the balun. Due to different phase relationships of the balanced signal and the unbalanced signal the impedance of the circuit in between the first connection of the balanced port towards ground may be different from the impedance of the circuit in between the second connection of the balanced port towards ground. This may lead to a different current flow over these parasitic capacitances.

In an embodiment, the first capacitor and the second capacitor of the balun may be of different capacitance value. This may allow compensating for the parasitic capacitances of the balun. The choice of the size of the first capacitor and the second capacitor may allow tuning the impedances as seen from the first and second connection, e.g. the circuit connected to the balanced port of the balun. The difference between the different capacitance values may be at least 10 pF, in particular at least 50 pF.

In an embodiment, the balun may include a third capacitor. The third capacitor may connect the second end of the first resistor to ground. This may improve the performance of the balun, as the DC voltage coming from the balanced signal port of the balun may be reduced or even cut off. This will improve the performance of the balun as its saturation with DC voltage may be avoided.

In another embodiment, the balun may include a fourth capacitor, which may connect the first capacitor and the second capacitor to ground, wherein the fourth capacitor may be connected in parallel to the first resistor. The performance and signal quality of the balun may be improved in this embodiment as harmonics from the balanced signal port of the balun may be reduced or even cut off.

The third and preferably also the fourth capacitor may have values in the range of 1 pF to 800 pF.

The third and preferably also the fourth capacitor may be configured for a frequency between 10 kHz and 200 MHz.

The third and preferably also the fourth capacitor may be configured for a maximum voltage larger than 200 V.

In an embodiment of the balun, the single-ended signal port may be designed to carry a load. The load, in particular a plasma load, may be connected to the third connection. In this configuration, the single-ended signal port may serve as output port of the balun and the balanced signal port may serve as input port of the balun.

In another embodiment, the fourth connection of the balun may be connected to ground in a low-inductive manner. This may also improve the performance of the balun.

A particularly low-inductive connection may be realized by one or more of the following measures: particularly wide striplines (wider than 5 mm), a plurality of through-connections (more than two) between the fourth connection and a ground plane that may be arranged in a row or in an area, particularly short striplines, for example with the ratio of length to width of the stripline being smaller than 100, more particularly smaller than 10 and preferably less than 3.

An amplifier may include a balun as described above. In a preferred embodiment, the balun may be connected to the output port of the amplifying stage of the amplifier and may serve as output balun. This may realize the transformation of a balanced signal at the output of the amplifying stage to an unbalanced signal at the output of the balun, as might be required by the load of the amplifier. This might be the case for a plasma load at the output of the amplifier in particular.

In a preferred configuration, the amplifying stage may comprise a first transistor and a second transistor for achieving the amplification of the signal. The balun might then serve as the output balun of the amplifier, where the first transistor may be connected to the first connection of the balun and the second transistor may be connected to the second connection of the balun. In an embodiment, the amplifying stage may be realized as a push-pull configuration of the first transistor and the second transistor.

In an embodiment where the balun may be an output balun of an amplifier, the first resistor may dissipate unwanted even harmonics from internal resonances that may occur in the circuit of the amplifying stage. It may attenuate local resonances, in particular harmonics. Overshoots in drain voltage may be minimized, so that drain voltage may go up to around 650 V for matched conditions. Matched conditions may be achieved when the impedance of the load is matched to the impedance of the output port. This impedance may preferably be in the range of 20Ω to 100Ω, especially 50Ω+/−10Ω.

Preferably, the amplifier may be an amplifier for the Medium Frequency (MF) range between 10 kHz to 2 MHz, in particular 10 kHz to 1 MHz, preferably 100 kHz to 2 MHz. In another preferred embodiment, the amplifier may be an amplifier for the radio frequency range from 2 MHz up to 200 MHz. The amplifier might be configured to realize a high power amplifier, in particular a switch mode amplifier, more particularly a class E amplifier or a Class D amplifier In one embodiment the amplifier might be configured to work in a class F or invers Class F (Class F-1) mode.

The basic circuits and functionality of Class D, E, F and $F^{-1}$ amplifiers are described e.g. in EP 1601 098 B1 in particular in FIGS. 1 and 2A-2F and corresponding paragraphs [006] to [0014].

FIG. 1 shows a balun 100 with a balanced port 110 comprising a first connection 130 and a second connection 140. The balanced port 110 is connected to a first winding 10 of the balun 100. Connected to the second winding 20 of the balun 100 is the unbalanced port 120 comprising a third connection 150 and a fourth connection 160. The fourth connection 160 is connected to ground 30. In the case where the balanced port 110 is the input port of the balun 100 and the unbalanced port 120 is the output port of the balun 100, the first winding 10 could for example be called the primary winding of the balun and the second winding 20 could for example be called the secondary winding of the balun 100. The balun 100 may also be operated in the inverse direction, i.e. the balanced port 110 being the output port and the unbalanced port 120 being the input port.

Shown in FIG. 1 are the parasitic capacitances $C_{para}$ in between the first winding 10 and the second winding 20. Also shown are a first capacitor 170 and a second capacitor 180 to allow for compensation of the parasitic capacitances $C_{para}$. Due to different phase relationships of the balanced signal and the unbalanced signal the impedance of the circuit in between the first connection 130 of the balanced port 110 towards ground 30 is different from the impedance of the circuit in between the second connection 140 of the balanced port 110 towards ground 30. This leads to a different current flow over these parasitic capacitances $C_{para}$. Therefore, the first capacitor 170 and the second capacitor 180 of the balun 100 may be chosen to be of different size. This allows compensating for the parasitic capacitances $C_{para}$ of the balun 100. The choice of the size of the first capacitor 170 and the second capacitor 180 allows to tune the impedances as seen from the first connection 130 and second connection 140, e.g. the circuit connected to the balanced port 110 of the balun 100.

The first capacitor 170 is connected to the first connection 130 on one side and to a first end 210 of a first resistor 190 on the other side. The second capacitor 180 is connected to the second connection 140 on one side and the first end of the first resistor 190 on the other side. The second end 220 of the first resistor 190 is connected to ground 30. The advantageous effect of the first resistor 190 is that any unwanted common mode current flowing from both connections 130, 140 of the balanced port 110 can be limited via the first resistor 190. This is particularly advantageous in case there is a risk of resonance of common mode current in the circuit. This might be the case of the balun 100 being an output stage of an amplifier 250 (FIG. 2), where the first resistor may then dissipate unwanted even harmonics from internal resonances in the amplification stage of the amplifier 250.

In the embodiment shown in FIG. 1, a third capacitor 200 is placed in between the second end 220 of the first resistor 190 and ground 30. The third capacitor 200 can be designed to cut direct current voltage coming from the balanced port 110. In a further embodiment, a fourth capacitor (not shown) can be connected in parallel to the first resistor 190. The aim of this fourth capacitor is to cut harmonics voltage coming from the balanced port 110. This embodiment can be realized with or without the third capacitor 200.

Figure 2:
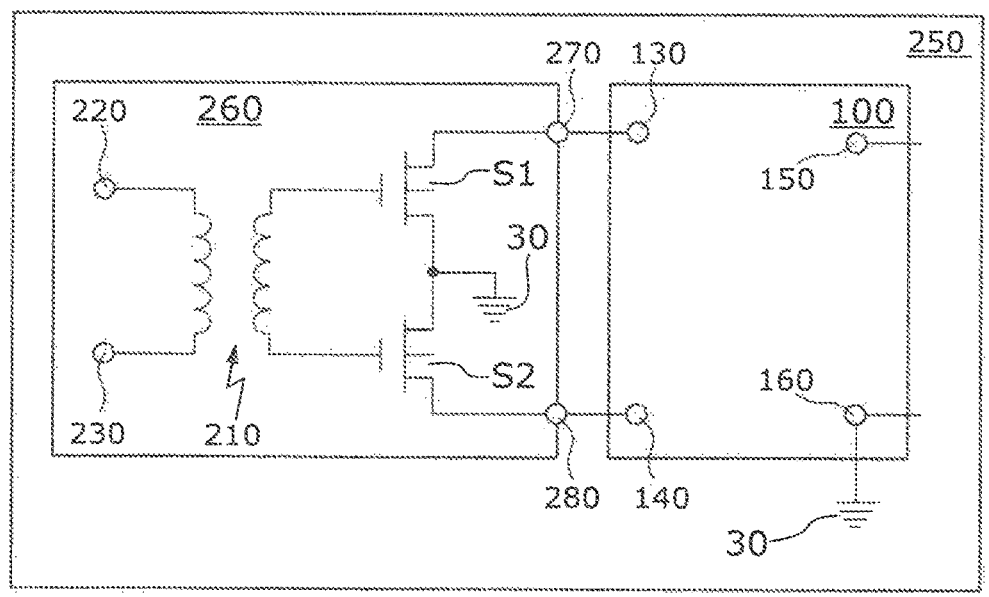
FIG. 2 provides a schematic view of an amplifier including a balun.

FIG. 2 shows a high-frequency amplifier 250 with an amplification stage 260 that has two output connections 270, 280. The output connections 270, 280 are connected to the input connections 130, 140 of a balanced port 110 of a balun 100.

The balun 100 has an output port 120 with connections 150, 160. Output connection 160 is connected to ground 30. A load not shown here, in particular a plasma load, can be connected to output connection 150.

The amplification stage 260 has switching elements S1, S2, which in this case are designed as transistors, in particular as LDMOS transistors. The switching elements S1, S2 are controlled via a signal transformer 210. The balun 100 is thus connected to a balanced signal on the input side and to an unbalanced signal on the output side.

The input connections 130, 140 of the balun, which has a primary winding 10 and a secondary winding 20, are connected to ground 30 via capacitors 170, 180.

The capacitance of the first capacitor 170 is preferably not equal to the capacitance of the second capacitor 180. The first and second capacitors 170, 180 allow the impedances represented by the balun 100 for the switching elements S1, S2 to be tuned. Usually the first and second capacitors 170, 180 are assumed symmetrical, since both switching elements S1, S2 should see the same impedance. However, different capacitances of capacitors 170, 180 may be foreseen. This may improve the performance of the balun 100. This due to the fact that the effects that cause parasitic capacitances can be at least partially compensated or eliminated by the first and second capacitors 170, 180. The parasitic capacitances occur, for example, between the input and output connections 130, 140 and 150, 160. They are marked as $C_{para}$ in FIG. 1.

Figure 3:
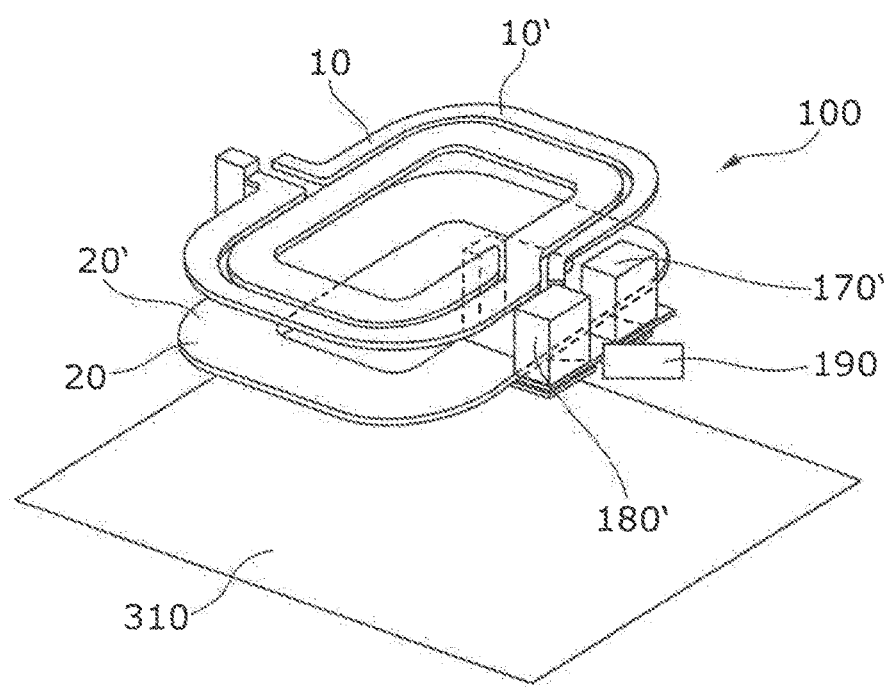
FIG. 3 provides a schematic view of a possible structure realizing a balun.

Capacitors 170, 180 can at least partly be designed as discrete capacitors 170', 180' (FIG. 3). Alternatively or additionally, it is also conceivable to form the first and second capacitors 170, 180 at least partially by means of striplines on a printed circuit board (PCB) which are spaced from a ground plane 310, which can for example be a metallic ground plane. This is particularly useful with a planar design of the balun 100, as shown schematically in FIG. 3. First resistor 190 can be seen near the first and second capacitors 170, 180, connected with one of its connections to the capacitors 170, 180 and with the other end to ground directly or via a third capacitor (not shown in FIG. 3). Also an optional fourth capacitor (not shown in FIG. 3) may be electrically connected in parallel to the first resistor 190.

The stripline 20' of the secondary winding 20 of the balun has a different number of turns/windings than the primary winding 10. The stripline 10' of the primary winding 10 has a smaller width at least in one area than in other areas. The size of the capacitors 170, 180 can be adjusted by this measure.

Capacitors 170, 180 are thus at least partially realized by the striplines 10', 20', through which the primary winding 10 and the secondary winding 20 are constructed.

In particular, the capacitance of the first and second capacitors 170, 180 can result from the width of the striplines and the distance between the striplines and a ground plane 310. The ground plane 310 may be used as a cooling plate and is advantageously cooled by a fluid, for example water.

The capacitance of the capacitors 170, 180 can also be influenced by a suitable choice of the insulation material of the printed circuit board (PCB), in particular by the dielectric constant of the material. Capacitors 170, 180 are arranged in the immediate vicinity of secondary winding 20 and primary winding 10. This means that the side length or diameter of the area of the secondary winding 20 and primary winding 10 is greater than the distance of the secondary winding 20 and primary winding 10 from the terminals 130, 140, 150, 160 to the capacitors 170, 180.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A balun configured for a power range between 500 W and 5 kW output, the balun comprising:
    a balanced signal port comprising a first connection and a second connection;
    a single-ended signal port comprising a third connection and a fourth connection, the fourth connection being connected to ground;
    a first capacitor disposed between the first connection and a first end of a first resistor;
    a second capacitor disposed between the second connection and the first end of the first resistor; and
    a third capacitor connecting a second end of the first resistor to ground.

2. The balun according to claim 1, further comprising a primary winding connected to the balanced signal port and a secondary winding connected to the single-ended signal port.

3. The balun according to claim 1, wherein the first capacitor and the second capacitor have different capacitances.

4. The balun according to claim 1, wherein the first resistor is between 10 Ω and 200 Ω.

5. The balun according to claim 1, wherein the rated voltage for the first resistor is between 100 V and 1000 V.

6. The balun according to claim 1, wherein the first capacitor is configured for a frequency between 10 kHz and 200 MHz.

7. The balun according to claim 1, wherein the first capacitor is configured for a maximum voltage larger than 200 V.

8. The balun according to claim 1, wherein the first resistor is configured to reduce common mode current at the balanced signal port of the balun.

9. The balun according to claim 1, further comprising a fourth capacitor connecting the first capacitor and the second capacitor to ground, the fourth capacitor being connected in parallel to the first resistor.

10. The balun according to claim 1, wherein the single-ended signal port is configured to carry a load.

11. The balun according to claim 1, wherein the fourth connection is connected to ground in a low-inductive manner.

12. The balun according to claim 2, wherein the primary winding and the secondary winding are provided in a planar manner with strip lines on a printed circuit board.

13. The balun according to claim 2, wherein a stripline of the secondary winding has a different number of turns than the primary winding.

14. The balun according to claim 2, wherein a stripline of the primary winding has a smaller width at least in one area than in other areas.

15. The balun according to claim 12, wherein the printed circuit board is spaced from a ground plane.

16. The balun according to claim 12, wherein the first and second capacitors are at least partially realized as a result of a width of the striplines and a distance between the striplines and a ground plane.

17. An amplifier including a balun according to claim 1.

18. The amplifier according to claim 17, wherein the balun is connected to an output port of an amplifying stage of the amplifier and is configured to serve as an output balun to realize a transformation of a balanced signal at the output of the amplifying stage to an unbalanced signal at the output of the balun.

19. The amplifier according to claim 18, wherein the output of the balun is connected to a plasma load.

20. The amplifier according to claim 17, further comprising:
a first transistor connected to the first connection; and
a second transistor connected to the second connection,
wherein the balun is an output balun.

21. The amplifier according to claim 20, wherein the amplifier is a push-pull amplifier.

22. The amplifier according to claim 17, wherein the amplifier is a medium frequency amplifier in a range between 10 kHz and 2 MHz.

23. The amplifier according to claim 17, wherein the amplifier is a radio frequency amplifier in a range between 2 MHz and 200 MHz.

24. The amplifier according to claim 17, wherein the amplifier is configured to realize a highpower amplifier.

25. The amplifier according to claim 17, wherein the amplifier is configured to work in one or more of a class D mode, a class E mode, a class F mode or an inverse Class F mode.

26. The amplifier according to claim 20, wherein the transistors are LDMOS transistors.

* * * * *